United States Patent [19]

Machuga et al.

[11] Patent Number: 5,523,920
[45] Date of Patent: Jun. 4, 1996

[54] PRINTED CIRCUIT BOARD COMPRISING ELEVATED BOND PADS

[75] Inventors: Steven C. Machuga, Palatine; Janice M. Giesler, Deerfield; Grace O'Malley, Schaumburg, all of Ill.; Charles A. McPherson, Montville, N.J.

[73] Assignee: Motorola, Inc., Schaumburg, Ill.

[21] Appl. No.: 176,992

[22] Filed: Jan. 3, 1994

[51] Int. Cl.⁶ ................................................. H05K 7/10
[52] U.S. Cl. .................... 361/767; 174/261; 228/180.21; 228/180.22; 257/773; 257/778; 257/779; 361/760; 361/777
[58] Field of Search ...................... 174/250, 261; 228/179.1, 180.1, 180.21, 180.22, 178.1; 257/778, 779, 700, 723, 724; 361/760, 767, 771, 774, 807, 808, 809, 777; 439/68, 83, 91

[56] References Cited

U.S. PATENT DOCUMENTS

| | | | |
|---|---|---|---|
| 3,189,978 | 6/1965 | Stetson | 29/830 |
| 3,192,086 | 6/1965 | Gyurk | 156/252 |
| 3,716,907 | 2/1973 | Anderson | 361/767 |
| 4,336,551 | 6/1982 | Fujita et al. | 257/778 |
| 5,075,965 | 12/1991 | Carey et al. | 228/180.22 |
| 5,187,020 | 2/1993 | Kwon et al. | 439/91 |
| 5,282,565 | 2/1994 | Melton | 228/180.22 |
| 5,291,374 | 3/1994 | Hirata et al. | 361/760 |
| 5,311,404 | 5/1994 | Trask et al. | 361/767 |
| 5,316,788 | 5/1994 | Dibble et al. | 257/778 |
| 5,329,068 | 7/1994 | Hirata et al. | 361/767 |
| 5,357,060 | 10/1994 | Yamashita | 361/767 |
| 5,383,093 | 1/1995 | Nagasaka | 361/767 |
| 5,400,221 | 3/1995 | Kawaguchi | 361/767 |
| 5,400,950 | 3/1995 | Myers et al. | 228/180.22 |

FOREIGN PATENT DOCUMENTS

| | | | |
|---|---|---|---|
| 4131413 | 10/1992 | Germany | 257/778 |
| 62-293729 | 12/1987 | Japan | 257/778 |
| 1-54797 | 3/1989 | Japan | 228/180.22 |
| 4-355933 | 12/1992 | Japan | 257/778 |
| 2202094 | 9/1988 | United Kingdom | 361/760 |

Primary Examiner—Donald A. Sparks
Attorney, Agent, or Firm—Douglas D. Fekete

[57] ABSTRACT

A printed circuit board (10) comprises a polymeric coating (30) and a metal circuit trace (26) applied to a substrate (22). The coating defines an opening (32) whereat the substrate is uncoated. The metal circuit trace includes a runner section (28) that is covered by the polymeric coating and a bond pad (20) integrally formed to the runner section at the opening and having an upper surface (40) that includes lip (36) overlying the polymer coating to facilitate positioning of a component for solder bonding to the pad. The bond pad preferably also includes a surface accessible within the opening to enhance solder bonding to the bond pad.

3 Claims, 2 Drawing Sheets

PRINTED CIRCUIT BOARD COMPRISING ELEVATED BOND PADS

BACKGROUND OF THE INVENTION

This invention relates to an improved printed circuit board for mounting electrical components. More particularly, this invention relates to a printed circuit board having bond pads for soldering a component to the board, which bond pads are formed in an opening of a polymeric coating overlying the board and are elevated above the coating to facilitate soldering operations.

It is known to manufacture a microelectronic package that comprises a microelectronic component, such as an integrated circuit die, mounted onto a printed circuit board by plurality of solder bump interconnections. For this purpose, a plurality of solder bumps are affixed to a face of the component. The board comprises a copper circuit trace that includes bond pads. For assembly, the component is arranged with the printed circuit board such that each solder bump rests on a corresponding bond pad on the board. The assembly is heated to a temperature sufficient to melt the solder bump, whereupon the molten solder is reflowed and wets the bond pad. Upon cooling, the solder resolidifies and bonds to the bond pad to complete the solder bump interconnection.

During reflow, there is a tendency for the molten solder to spread along the circuit trace, which, if uncontrolled, depletes solder from the desired interconnection and leads to catastrophic collapse of the component against the board. Therefore, a solder mask is applied to the board to confine the molten solder to the bond pad. A suitable solder mask comprises a coating formed of a polymeric material that is not wettable by molten solder. Openings are formed in the coating to expose the bond pads. As a result, the bond pads are recessed beneath the surface of the coating. It is then necessary to accurately position the component so that each bump is inserted within the corresponding microscopic opening and rests against the bond pad, which is essential for forming a strong solder bond. Moreover, it is found that stresses within interconnections formed in this manner are poorly distributed, thereby leading failure to of the solder bond and shortening the useful life of the package. Thus, there is a need for a printed circuit board that comprises bond pads having bonding surfaces that lie above the polymeric coating to facilitate the positioning of the component and reduce stress within the solder connections, thereby improving the reliability of the solder bonds and extending the useful life of the package.

BRIEF DESCRIPTION OF THE DRAWINGS

The present invention will be further illustrated with reference to the accompanying drawings wherein.

DETAILED DESCRIPTION OF A PREFERRED EMBODIMENT

Figure 1:
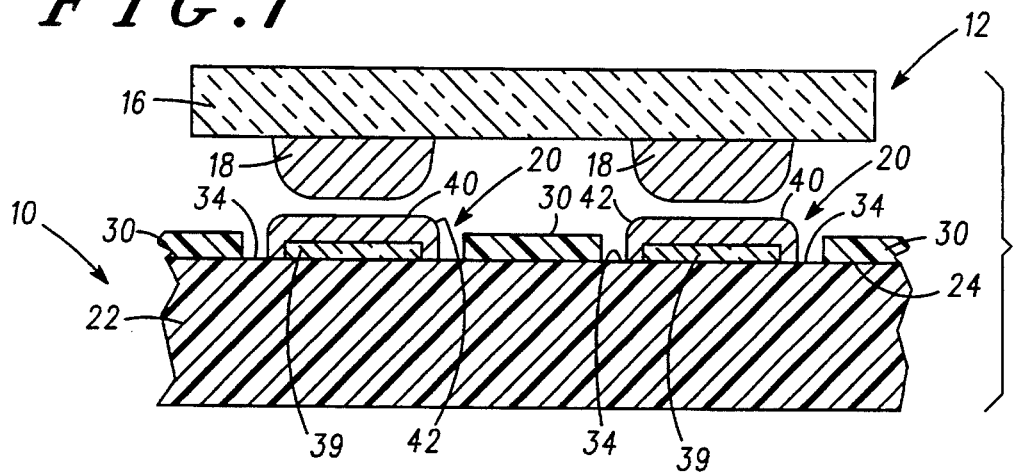
FIG. 1 is a cross-sectional view showing, prior to assembly, a microelectronic component and a printed circuit board having bond pads in accordance with this invention.
Figure 6:
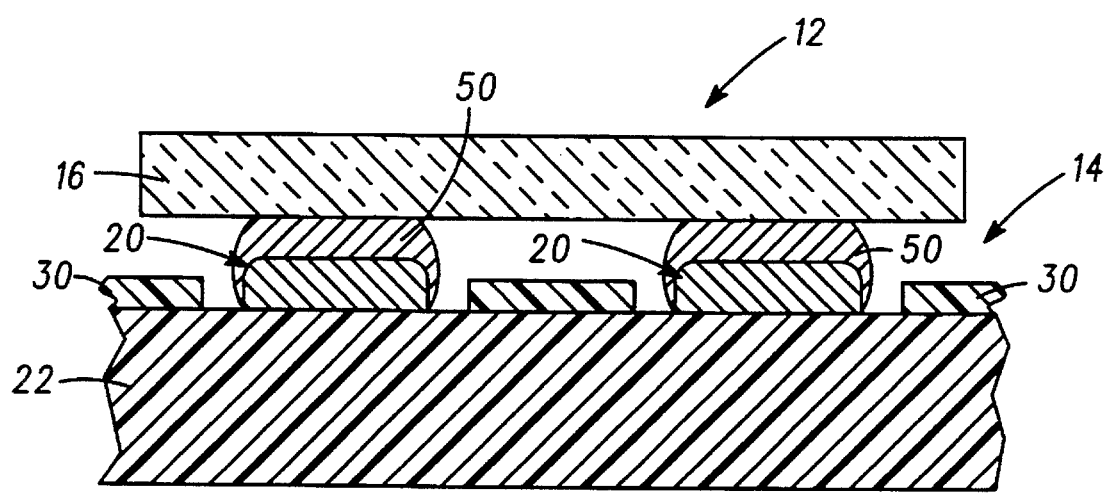
FIG. 6 is a cross-sectional view of the microelectronic package formed by the components in FIG. 1.

Referring to FIG. 1, in accordance with this invention, a printed circuit board 10 is provided for assembly to a microelectronic component 12 to form microelectronic package 14 in FIG. 6. In a preferred embodiment, component 12 comprises an integrated circuit die 16 having a plurality of preformed solder bumps 18 for forming solder bump interconnections to printed circuit board 10. Printed circuit board 10, in turn, includes a plurality of bond pads 20 in accordance with this invention. Bond pads 20 are adapted for bonding to solder bumps 18 by a solder reflow process and are accordingly disposed in a pattern onto which solder bumps 18 are superposable. For purposes of illustration, the drawings depict formation of only a couple of solder bump interconnections, whereas it will be appreciated that a typical microelectronic package includes up to several hundred such solder bump interconnections arranged in a regular array or other suitable pattern.

Figure 2:
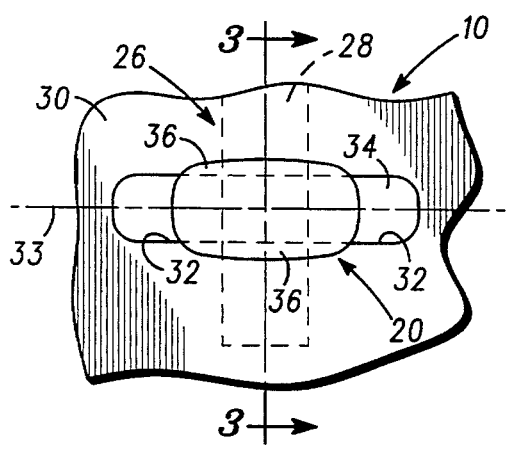
FIG. 2 is a plan view of a surface region of the printed circuit board in FIG. 1 showing a bond pad.
Figure 3:
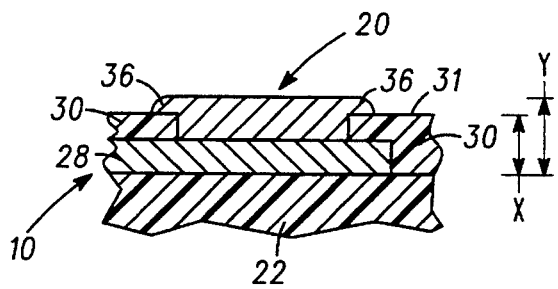
FIG. 3 is a cross-sectional view of the surface region in FIG. 2 taken along the line 3—3 in the direction of the arrows.

Referring to FIGS. 1 through 3, printed circuit board 10 comprises a dielectric substrate 22. A preferred substrate 22 is of the type referred to as an FR4 card and is composed of an epoxy resin and glass fiber laminate. Substrate 22 comprises a planar face 24 onto which component 12 is mounted. A circuit trace 26 is affixed to surface 24 and is formed of metallic copper. Circuit trace 26 includes a runner section 28 and bond pad 20. Printed circuit board 10 further includes a polymeric coating 30, referred to as a solder mask, applied to face 24 and having a substantially planar surface 31. Referring more particularly to FIGS. 2 and 3, coating 30 overlies runner section 28 and defines an opening 32 through which bond pad 20 extends. It is pointed out that an area 34 of face 24 is exposed through opening 32 about bond pad 20. Bond pad 20 includes a lip 36 overlying coating 30.

Figure 4:
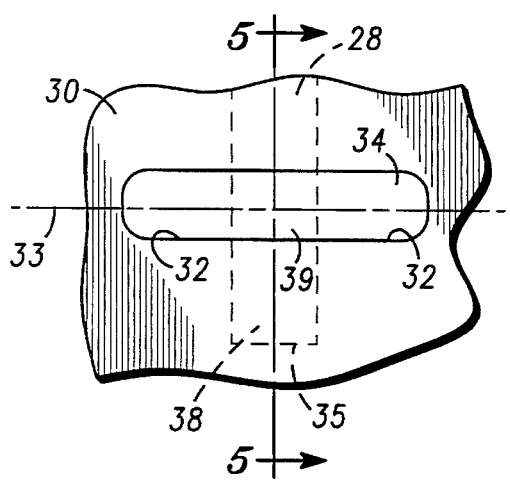
FIG. 4 is a plan view of the surface region in FIG. 2 during an intermediate stage of fabrication.
Figure 5:
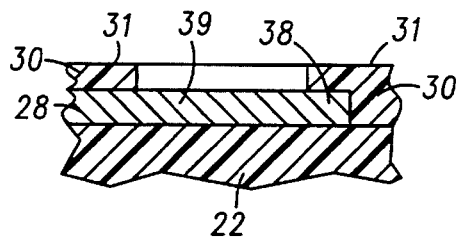
FIG. 5 is a cross-sectional view of the region in FIG. 4 taken along line 5—5 in the direction of the arrows.

Referring to FIGS. 4 and 5, in the fabrication of printed circuit board 10, a copper layer is initially applied and etched to substantially define trace section 38 that includes runner section 28 and a base 39 for bond pad 20. Polymeric coating 30 is applied to surface 24 and developed to define opening 32. A suitable coating is formed of a photo-imageable epoxy resin and is developed by selective exposure to light, using a shadow mask to protect the areas corresponding to the desired openings, whereafter unexposed material is dissolved in solvent to form openings 32. The resulting coating covers runner section 28 and exposes section 39. Opening 32 is preferably elongated along a lateral axis 33 generally perpendicular to runner 28 and is disposed spaced apart from end 35 of the trace section, to permit increased tolerance in designing and positioning the shadow mask to expose region 39. As a result, a exposed area of base 39 is substantially constant despite minor variations in the positioning of the mask. In addition, the elongated opening exposes regions 34 of face 24 adjacent to base 39.

Following the application of coating 30, the board is immersed an electroless copper plating solution to deposit copper onto base 39 to form bond pad 20. A suitable plating bath is composed of an aqueous alkaline solution containing copper sulfate and formaldehyde. At the copper surface, copper ions are reduced by the formaldehyde to form metallic copper that deposits on the surface. In contrast, no such reaction occurs at the polymer surfaces of either the coating or the exposed areas of the substrate. In this manner, copper deposition is limited initially to the copper surface of base 39 and thereafter to the nascent copper deposit. The plated copper merges the copper of base 39 to form an integral body. Copper deposition is continued for a time sufficient to produce a deposit having a substantially planar upper surface 40 that lies above surface 31 of the polymeric coating. As the copper deposit grows above the polymer coating, deposition commences laterally, causing the copper to expand onto the polymer surface to form lips 36. Optionally, following deposition of the copper, the board may be immersed in an electroless nickel plating solution and an electroless gold plating solution to thin films of nickel and gold to protect the copper surface against oxidation that might otherwise interfere with wetting by molten solder during reflow operations.

Thus, each bond pad 20 is formed of an integral copper body and features a solder-wettable surface that includes generally flat upper surface 40 and lateral surfaces 42 disposed within the opening spaced apart from the coating. Referring to FIG. 3, polymeric coating 30 has a planar surface 31 and is characterized by a thickness x measured from face 24 of substrate 22. It is a significant feature of this invention that bond pad 20 has a height y measured between the upper surface 40 and the board surface 24 that is greater than the coating thickness x, such that the upper surface 40 is elevated above coating surface 31 to facilitate positioning of solder bumps 18 thereon. Lips 36 overlying coating 30 increase the area of surface 40 and thus increase the target for placement of the solder bumps. In addition, lateral surfaces 42 are accessible within the opening to improve solder bonding to the pad.

Following fabrication of bond pad 20, microelectronic component 16 is arranged with printed circuit board 10 such that solder bumps 18 rest upon surfaces 40 of bond pads 20. By way of an example, bumps 18 are suitably formed of a low melting, eutectic solder alloy. The assembly is then heated to a temperature sufficient to melt solder. Upon melting, the solder wets surfaces 40 and 42, but is inhibited from spreading onto the nonwettable polymer surface 31 and 34 of coating 30 and substrate 22. Thereafter, the assembly is cooled, whereupon the solder resolidifies to form solder bump interconnections 50 bonded to pads 20, as shown in FIG. 6.

Therefore, this invention provides a printed circuit board having a bond pad that comprises an upper surface that is substantially flat and is disposed above the solder mask and parallel to the board face. This is in large part attributed to the flat surface of the base onto which copper is deposited in building up the pad. The flat, elevated surface provides an enhanced target for positioning a component during assembly of a microelectronic package. The target area is also increased as a result of the plating that occurs laterally in forming lips that overlie the polymer surface. The printed circuit board is readily fabricated from inexpensive materials that are readily commercially available and using conventional processing techniques. Moreover, the bond pad is formed within an opening in the solder mask that extends about the pad and exposes lateral surfaces of the pad. This facilitates targeting of the pad area during exposure of the solder mask and enhances contact with the plating solutions. Thus, following reflow, the solder not only bonds to the upper surface, but also to the lateral surfaces. The flow of solder onto lateral surfaces provides a nonplanar bond interface that enhances distribution of stress during use and extends the useful life of the package.

While in the described embodiment solder connections are formed by reflowing solder bumps directly in contact with the bond pads, the printed circuit board in accordance with this invention may be suitably utilized in forming solder connections by other processes. For example, the flat, elevated bond surface provides an enhanced target for screen printing solder paste, in marked contrast to efforts to apply such paste onto a surface recessed within a microscopic hole.

While this invention has been described in terms of certain embodiments thereof, it is not intended that it be limited to the above description, but rather only to the extent set forth in the claims that follow.

The embodiments of the invention in which an exclusive property or privilege is claimed are defined as follows:

1. A printed circuit board comprising a substrate, a polymeric coating applied to the substrate and defining an opening whereat the substrate is uncoated, and a metal circuit trace affixed to the substrate and comprising a runner section covered by the polymeric coating and a bond pad integrally formed to the runner section at the opening, said bond pad having a continuous solder-wettable surface comprising an upper bond surface that lies above the polymer coating and includes a lid overlying the polymeric coating, said solder-wettable surface further comprising a lateral surface within the opening spaced apart from the polymeric coating to permit solder access to the lateral surface and thereby enhance solder bonding to the bond pad.

2. A printed circuit board in accordance with claim 1 wherein the coating has a thickness measured from the substrate and further wherein the bond pad has a height measured from the substrate that is greater than the coating thickness.

3. A printed circuit board comprising a substrate formed of a polymeric resin and having a generally planar substrate face, a polymeric coating applied to the substrate and having a polymer surface generally parallel to the substrate face and non-wettable by solder metal, said polymeric coating having a coating thickness and defining an opening that exposes an uncoated region of the substrate face and a metal circuit trace affixed to the substrate and formed substantially of copper metal, said metal circuit trace comprising a runner section coated by the polymeric coating and a bond pad integrally formed to the runner section at the opening, said bond pad comprising a solder-wettable surface that includes an upper surface and a lateral surface, said upper surface being substantially flat and parallel to the substrate face at a height from said substrate face greater than the coating thickness such that the upper face is disposed above the polymer surface, said bond pad comprising a lip overlying the polymeric coating and forming a portion of the upper surface to provide increased area for positioning a component thereon, said lateral surface being disposed within the opening and extending continuously between said upper surface and the uncoated region of the substrate face and spaced apart from the polymeric coating to provide access to said lateral surface for enhanced solder.

\* \* \* \* \*

UNITED STATES PATENT AND TRADEMARK OFFICE
CERTIFICATE OF CORRECTION

PATENT NO. : 5,523,920
DATED : June 4, 1996
INVENTOR(S) : Steven C. Machuga, Janice M. Giesler, Grace O'Malley, and Charles A. McPherson It is certified that error appears in the above-indentified patent and that said Letters Patent is hereby corrected as shown below:

At column 4, line 27, "lid" should be --lip--.

Signed and Sealed this

Twenty-sixth Day of November 1996

Attest:

BRUCE LEHMAN

Attesting Officer

Commissioner of Patents and Trademarks